United States Patent [19]

Gosney, Jr. et al.

[11] 4,331,968
[45] May 25, 1982

[54] THREE LAYER FLOATING GATE MEMORY TRANSISTOR WITH ERASE GATE OVER FIELD OXIDE REGION

[75] Inventors: William M. Gosney, Jr., McKinney; Vernon G. McKenny, Carrollton, both of Tex.

[73] Assignee: Mostek Corporation, Carrollton, Tex.

[21] Appl. No.: 130,853

[22] Filed: Mar. 17, 1980

[51] Int. Cl.³ .................................. H01L 29/78
[52] U.S. Cl. .................................. 357/23; 357/41; 357/54; 357/59; 365/185
[58] Field of Search ............ 357/23, 59, 41, 54; 365/185

[56] References Cited

U.S. PATENT DOCUMENTS

| | | |
|---|---|---|
| 3,755,721 | 8/1973 | Frohman-Bentchkowsky ..... 357/23 |
| 3,996,657 | 12/1976 | Simko et al. .................. 357/59 |
| 4,099,196 | 7/1978 | Simko .......................... 357/59 |
| 4,115,914 | 9/1978 | Harari .......................... 357/23 |
| 4,142,920 | 3/1979 | Morgan ......................... 357/23 |
| 4,203,158 | 5/1980 | Frohman-Bentchkowsky et al. ............................. 357/59 |

OTHER PUBLICATIONS

A. Scheibe et al., "Tech. of a New N-Channel One-Transistor Earom Cell Called Simos," IEEE Trans. on Elec. Dev., vol. Ed.-24, #5, May 1977, pp. 600-606.
C. Neugebauer et al., "Electrically Eras. Buried-Gate Nonvol. Read-Only Mem.," IEEE Trans. on Elec. Dev., vol. Ed-24, #5, May 1977, pp. 613-618.

Primary Examiner—Joseph E. Clawson, Jr.

[57] ABSTRACT

A field effect transistor storage device for use in programmable read-only memories of the type employing a floating gate and a control gate overlying and aligned with the floating gate. An erase gate is provided adjacent at least one edge of the floating gate for removing charge stored on the floating gate. A method of electrically erasing the storage device includes holding the control gate at a fixed potential to thereby hold the floating gate at a substantially fixed potential while a relatively low voltage is applied to the erase gate to remove charge stored on the floating gate.

2 Claims, 2 Drawing Figures

THREE LAYER FLOATING GATE MEMORY TRANSISTOR WITH ERASE GATE OVER FIELD OXIDE REGION

BACKGROUND OF THE INVENTION

The present invention relates to floating gate field effect transistor storage device and more particularly to an electrode arrangement for electrically erasing such floating gate device.

References known to the present applicants which may be relevant to the present invention include: U.S. Pat. No. 3,755,721 issued to Frohman-Bentchkowsky; U.S. Pat. No. 3,996,657 issued to Simko et al.; U.S. Pat. No. 4,115,914 issued to Harari; U.S. Pat. No. 4,142,926 issued to Morgan; the publication entitled "Electrically Erasable Buried-Gate Nonvolatile Read-Only Memory" by Neugebauer et al. *IEEE Transactions on Electron Devices* Vol. ED-24, No. 5, May 1977, pages 613 to 618; and the publication entitled "Technology of a New n-Channel One Transistor EAROM Cell Called SIMOS" by Scheibe et al. *IEEE Transactions on Electron Devices* Vol. ED-24, No. 5, May 1977, pages 600 through 606.

The above referenced Scheibe publication teaches a stacked gate memory device which takes advantage of the one transistor memory cell and allows for electrical erasing of information stored in the cell. The one transistor cell is desirable since it requires less space on the surface of a silicon substrate so that more information may be stored in a given area. The stored information in such a device may be electrically erased by application of a relatively high voltage, on the order of 50 volts, to the source in the respect to both substrate and gate. To provide the electrically erasable feature, this reference teaches a modified stacked gate configuration in its FIG. 7 which uses additional area on the integrated circuit layout.

The Neugebauer publication provides a small erase gate overlying a floating gate in a two transistor memory cell. Since the erase gate overlies only a portion of the floating gate, capacitive coupling between the erase and floating gate is reduced so that less voltage is required in the erase cycle. Even so, this device requires an erase voltage of 30 to 35 volts.

The above referenced U.S. Pat. No. 3,755,721 provides a good disclosure of the Avalanche Injection technique for charging floating gates in solid state storage devices. However, the only technique taught in that patent for erasing the stored information is exposure of the device to ultraviolet or x-ray radiation.

The above referenced U.S. Pat. No. 3,996,657 employs hot carrier injection of charge through the gate oxide layer to write information on a floating gate. This patent also teaches that, in addition to erasing by exposure to ultraviolet light, electrical erasure can be achieved by application of a large positive voltage to the control gate 20.

The above referenced U.S. Pat. No. 4,115,914 provides a stacked gate arrangement in which the oxide between floating gate and substrate has one portion which is sufficiently thin for generation of tunnel currents. In this device, the typical Avalanche Injection technique is used for writing of information while the tunnel currents are used for erasing.

The above referenced U.S. Pat. No. 4,142,926 teaches a method for producing self-aligned stacked gate structures useful in the programmable read-only memories which employ the one transistor storage cell arrangement.

It can be seen from the above references that it is desirable to employ the one transistor storage cell in programmable read-only memories to achieve the maximum storage density. Likewise, it can be seen from these references that an electrically erasable cell is quite desirable in such memories. While the ultraviolet light erasable cells have proven quite useful, they generally require a special package with a transparent lid and require that the device be physically removed from a circuit board and positioned for exposure to an appropriate light source. While it is known that electrical erasure can be achieved in a stacked gate structure, it is also known that relatively high voltages must be applied, for example to the control gate, to achieve the electrical erasure. These erasure voltages are typically greater than the breakdown voltages of the various nodes within the integrated circuit and thus often lead to destruction of the device or require excessively high currents. A device which would be electrically erasable at a voltage on the order of the write voltage, typically 25 volts, or below would be desirable. The known electrical erasing structures also occupy additional space on the integrated circuits and thereby reduce storage density.

SUMMARY OF THE INVENTION

Accordingly, an object of the present invention is to provide an electrically erasable floating gate field effect transistor storage device.

Another object of the present invention is to provide an electrically erasable storage device useful as a one transistor per bit programmable read-only memory cell.

Another object of the present invention is to provide an electrical erasing structure which does not increase memory cell size.

Yet another object of the present invention is to provide a floating gate field effect transistor storage device which may be erased by application of a relatively low voltage.

These and other objects of the present invention are achieved by providing a field effect transistor storage device having a floating gate, a control gate, and an erase gate. The floating gate is preferably self-aligned and completely covered by the control gate. The erase gate is positioned adjacent at least one edge of the floating gate. Electrical erasure is performed by holding the control gate at a fixed voltage while a relatively low erase voltage is applied to the erase gate with current flowing from the edge of the floating gate to the erase gate.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
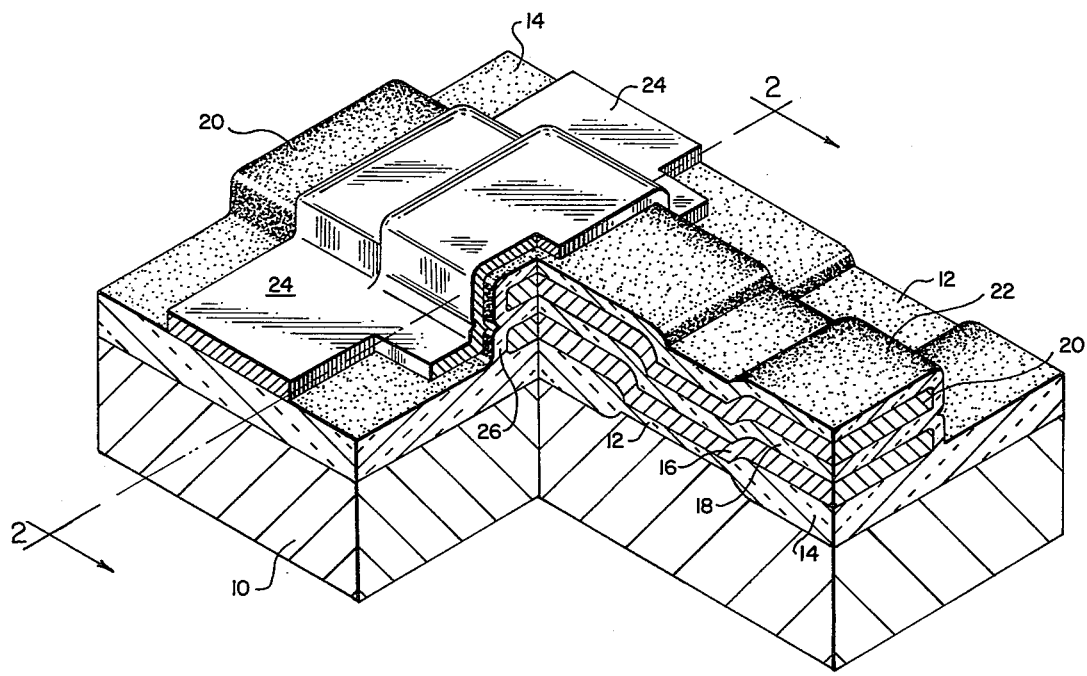
FIG. 1 is a sectioned perspective view of a portion of a single memory cell in a programmable read-only memory according to the present invention.

With reference now to FIG. 1, there is provided a sectioned perspective view of a single transistor floating gate memory cell according to the present invention. It will be appreciated that this cell would be only one of thousands of similar cells provided in a typical programmable read-only memory. The cell of FIG. 1 is formed on a silicon substrate 10 which may be, for example, doped with a p-type impurity. An active region on the upper surface of substrate 10 is defined by a thin oxide layer 12 extending generally from left to right in FIG. 1. The remaining portions of the upper surface of substrate 10 are covered by a thick oxide layer 14 beneath which the substrate is typically heavily doped with a p-type impurity to generate a channel stop.

In this preferred embodiment of FIG. 1, the illustrated conducting layers are provided by application of three polycrystalline silicon layers with appropriate intermediate insulating oxide layers. A first polycrystalline silicon layer is deposited directly over the oxides 12 and 14 and patterned to form a floating gate structure 16. In this preferred embodiment, the floating gate 16 extends completely across the thin oxide layer 12 and overlaps the thick oxide regions 14 on both sides of the active area. An oxide layer 18 is formed covering the floating gate 16 on its upper surface and along all edges to totally electrically isolate the gate 16. A second layer of polycrystalline silicon is then deposited over the substrate and patterned to form a control gate 20. The second layer is patterned to preferably completely cover the floating gate 16 and to have the same width as gate 16 in the active area defined by thin oxide 12. As shown in FIG. 1, this control gate 20 may extend beyond the floating gate 16 in the thick or field oxide region 14 and typically continues across the integrated circuit to form the control gate of a plurality of other memory cells. Either after patterning of the floating gate 16 or the preferably self-aligned control gate 20, those portions of the active region not covered by the gates are doped with an n-type impurity to provide source and drain regions on opposite sides of the floating gate. The formation of self-aligned gate structures, including the stacked gate arrangement, is known in the art as illustrated by the above referenced U.S. Pat. No. 4,142,926. Openings may be made in the thin oxide 12 on opposite sides of the gates 16 and 20 to provide contacts as appropriate for the memory device.

After depositing and appropriately patterning a control gate 20, another oxide layer 22 is formed over the top surface and edges of the control gate 20. A third layer of polycrystalline silicon is then deposited upon the substrate and patterned to form an erase gate 24. As illustrated in FIG. 1, the gate 24 extends from right to left in the drawing to provide an erase gate structure for a plurality of other memory cells on the same substrate. The erase gate 24 overlies portions of both the floating gate 16 and the control gate 20. An important feature of the present invention is that in all areas where the erase gate 24 actually lies over floating gate 16, the control gate 20 is interposed therebetween. The control gate 20 therefore greatly limits capacitive coupling between the erase gate 24 and the floating gate 16. The erase gate 24 is immediately adjacent floating gate 16 only along the edges of gate 16 such as at the point 26. The total area of floating gate 16 which is adjacent to erase gate 24, is therefore extremely small.

Figure 2:
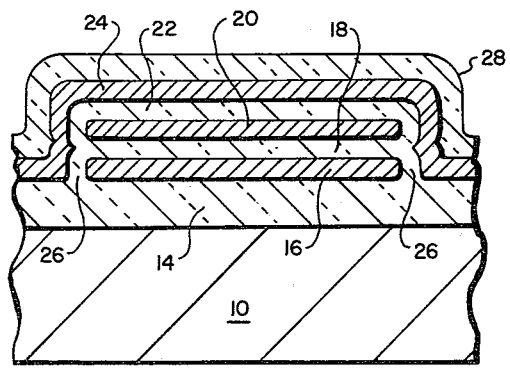
FIG. 2 is a cross section of the FIG. 1 embodiment taken along the line 2—2.

With references now to FIG. 2, a cross section taken along the line 2—2 of FIG. 1 is provided to show more detail of the electrode arrangement of the present invention. Most of the elements of FIG. 2 are also shown in FIG. 1 and carry the same designation numbers. It can be seen in FIG. 2 that the control gate 20 effectively blocks capacitive coupling between the floating gate 16 and erase gate 24. Only at the points 26 do the floating gate 16 and erase gate 24 directly oppose each other across an oxide insulating layer. The removal of charge stored on floating gate 16 is achieved by providing an appropriate voltage between the erase gate 24 and floating gate 16 which appears across the oxide at 26 causing current to flow through the oxide discharging the floating gate.

The operation of a programmable read-only memory according to the present invention will now be described with reference to FIGS. 1 and 2. Charge may be stored on the floating gate 16 by the Avalanche Injection current technique discussed in the above referenced patents. This technique is generally preferred over the tunnel current method since it allows the use of more reliable thin oxide layers 12. As noted in the above references, such writing process usually requires a voltage on the order of 25 volts applied, for example, from drain to source.

In the present invention, stored charge may be removed from the floating gate 16 by holding the control gate 20 at a fixed voltage, preferably ground, and applying a positive erase voltage to the erase gate 24. The capacitance between the floating gate 16, the control gate 20, and the substrate 10 is much greater than the capacitance between floating gate 16 and erase gate 24. Therefore, very little capacitive boosting of gate 16 occurs when the erase voltage is applied to gate 24. As a result, a high electrical field appears across the oxide at 26 to produce currents through the oxide for discharging gate 16. In initially designing the device shown in the figures, it was believed that an erase voltage on the order of 25 volts would be required to reliably remove charge from floating gate 16. Upon building test structures, it was discovered that reliable erasing occurs at lower voltages. The unexpected low erasing voltage is believed to be due to the high field generated along the relatively sharp edges of floating gate 16. Initial test devices could be erased at voltages of ten volts or less. Production versions with thicker oxides were found to require a maximum of twenty volts for erasing. This ten to twenty volt erasing level is quite compatible with the devices which use a 25 volt write signal, and avoid junction breakdown and excessive currents during the erase cycle.

In the present invention, it will be appreciated that the erase gate 24 has been positioned entirely over the thick oxide 14. This has been done to reduce stray capacitances in the active area but is not essential to the electrical erasing operation. Thus, if desired, the erase gate 24 may be positioned over the active region defined by the thin oxide 12 adjacent an edge of the floating gate 16.

The positioning of gate 24 also helps in improving memory density. It will be appreciated that a large number of memory cells share a common control gate 20. The erase gate 24 lies generally between a pair of memory cells and can provide the erasing function to both by overlapping portions of the floating gates over the thick oxide 14. Those skilled in the art will appreciate that this positioning does not require additional spacing between adjacent memory devices. The electrical erasing feature can therefore be added to such devices by using the structure of the present invention without reducing storage density.

It can be seen that a considerable area of the erase gate 24 is provided overlapping the control gate 20. Since the erasing occurs at the edges of the floating gate 16, most of this overlap can be eliminated if desired. Some overlap is generally required to compensate for mask misalignment when the third polycrystalline silicon layer is patterned.

It will be appreciated that in a completed device, a final oxide layer 28 is typically formed over the third polycrystalline layer 24 so that a layer of interconnecting metal may be provided to, for example, make appropriate contacts to the drain and source regions.

While the present invention has been illustrated and described in terms of particular structures and methods of use, it is apparent that various other changes and modifications can be made within the scope of the present invention as defined by the appended claims.

What is claimed is:

1. A field effect transistor storage device comprising:
   a semiconductor substrate having a source region, a channel region, and a drain region with a field oxide region surrounding said source, channel, and drain regions;
   a first dielectric layer over at least said channel region;
   a floating gate comprising a first polycrystalline silicon layer on said first dielectric layer, and overlying said channel region and a portion of said field oxide region;
   a second dielectric layer covering the top and edges of said floating gate;
   a control gate comprising a second polycrystalline silicon layer on said second dielectric layer and overlying said floating gate;
   a third dielectric layer covering the top and edges of said control gate; and
   an erase gate comprising a conductive layer adjacent at least one edge of said floating gate which overlies the field oxide region, said erase gate also overlies at least a portion of said control gate.

2. An electrode arrangement according to claim 1 wherein:
   said erase gate is formed from a third polycrystalline silicon layer deposited on said substrate over said second dielectric layer; and
   said erase gate is capacitively shielded from said floating gate upper surface by said control gate and said erase gate is electrically isolated from said floating gate edges by said first dielectric layer.

* * * * *